United States Patent [19]

Berg et al.

[11] Patent Number: 4,731,693

[45] Date of Patent: Mar. 15, 1988

[54] CONNECTION APPARATUS FOR INTEGRATED CIRCUIT

[75] Inventors: William E. Berg, Portland; John L. Addis, Beaverton, both of Oreg.

[73] Assignee: Tektronix, Inc., Beaverton, Oreg.

[21] Appl. No.: 912,898

[22] Filed: Sep. 29, 1986

[51] Int. Cl.$^4$ ............................................... H05K 7/20
[52] U.S. Cl. ............................... 361/386; 174/16 HS; 165/80.2; 357/81
[58] Field of Search ....................... 361/386, 387, 388; 357/81; 174/16 HS; 165/80.2

[56] References Cited

U.S. PATENT DOCUMENTS 4,255,003  3/1981  Berg .............................. 339/17 LM

FOREIGN PATENT DOCUMENTS 0085622  8/1983  European Pat. Off. .............. 357/81
3204683  8/1983  Fed. Rep. of Germany ...... 361/386

Primary Examiner—A. D. Pellinen
Assistant Examiner—Morris Ginsburg
Attorney, Agent, or Firm—John Smith-Hill

[57] ABSTRACT

An integrated circuit is mounted on the front face of a substrate of dielectric material and the substrate is fitted in an aperture that extends through a circuit board. The substrate has contact elements distributed about the periphery of its front face, and the circuit board has corresponding contact elements on its front face distributed about the periphery of the aperture. A first clamping member is positioned at the back face of the circuit board so as to extend over the aperture in the circuit board. The first clamping member is made of thermally-conductive material and is in thermally-conductive contact with the back face of the substrate. A second clamping member is positioned at the front face of the circuit board and extends at least partially over the peripheral area of the front face of the substrate. A resilient member is effective between the second clamping member and both the substrate and the circuit board. Fastening elements are used to draw the clamping members together and thereby press the resilient member into firm contact with the substrate and the circuit board. The resilient member has portions of conductive material that connect the contact elements of the substrate to the corresponding contact elements of the circuit board.

6 Claims, 6 Drawing Figures

CONNECTION APPARATUS FOR INTEGRATED CIRCUIT

This invention relates to connection apparatus for integrated circuits.

BACKGROUND OF THE INVENTION

U.S. Pat. No. 4,255,003 discloses a device for connecting a monolithic integrated circuit to a circuit board. The monolithic integrated circuit is mounted on a rectangular ceramic substrate that has connection pads distributed about the periphery of one main face of the substrate. The circuit board has corresponding connection pads exposed at one main face of the board about the periphery of a rectangular "footprint" region corresponding in shape and size to the main face of the ceramic substrate. The circuit board is formed with holes outside the footprint region. A clamping member has four rigid side portions that are connected together and form a rectangular frame. The side portions are formed with an endless groove at the underside of the frame. A frame-like body of elastomeric material projects downwardly from the underside of the clamping member and has a locating ridge that fits in the groove of the clamping member. Strips of conductive material are bonded to the underside of the body of elastomeric material. The elastomeric material is silicone rubber. At each corner, the clamping member has an ear that extends downwardly somewhat beyond the underside of the frame, and each ear is formed with a hole. The circuit board is formed with corresponding holes. Through use of screws extending downwardly through the holes in the ears and the corresponding holes in the circuit board, and nuts engaging the lower ends of the screws, the clamping member may be attached to the circuit board. When the clamping member is so attached, the elastomeric material is compressed and the strips of conductive material provide electrical connection between the connection pads of the substrate and the corresponding connection pads of the circuit board. The compression of the elastomeric material provides contact force between the strips of conductive material and the contact pads.

A practical implementation of the conventional connection device disclosed in U.S. Pat. No. 4,255,003 is designed for use with a substrate that is about 0.64 mm thick. The underside of the frame is stepped, in that the lower surface portion that is inward of the groove is at a height of 1.45 mm above the bottom of the ears and the lower surface portion that is outward of the groove is at a height of 0.81 mm above the bottom of the ears. When seen in cross-section, the body of elastomeric material has two lobes, for engaging the substrate and the circuit board respectively, and each extends 1.02 mm downwards from the relevant surface portion of the frame. When the clamping member is attached to the circuit board and the screws are tightened, each lobe is compressed to a thickness of 0.81 mm, so that the percentage compression of each lobe is about 20%. Of course, manufacturing tolerances result in the percentage compression of the lobes possibly being different from 20%. Nevertheless, the tolerances are sufficiently small, e.g. ∓0.05 mm on each component, that for all values of the percentage compression permitted by the manufacturing tolerances, adequate contact force is provided between the conductive strips and the pads of the substrate.

In the conventional connection device, the main mechanism for dissipation of heat from the integrated circuit is by conduction downwards through the ceramic substrate into the circuit board. Heat is removed from the bottom face of the circuit board by convection and/or conduction. Circuit board material, e.g. epoxy glass, is a relatively poor conductor of heat, and therefore the practical implementation of the conventional connection device is designed for use with circuit boards no thicker than about 0.64 mm, i.e. single layer circuit boards. It is, however, desirable to be able to use multilayer circuit boards that are about 1.57 mm thick. The high thermal resistance of such a circuit board places a relatively low limit on the amount of power that can be dissipated as heat without causing the temperature of the circuit board to increase excessively and consequently causing damage to the circuit board.

SUMMARY OF THE INVENTION

In a preferred embodiment of the invention, an integrated circuit is mounted on the front face of a substrate of dielectric material and the substrate is fitted in an aperture that extends through a circuit board. The substrate has contact elements distributed about the periphery of its front face, and the circuit board has corresponding contact elements on its front face distributed about the periphery of the aperture. A first clamping member is positioned at the back face of the circuit board so as to extend over the aperture in the circuit board. The first clamping member is made of thermally-conductive material and is in thermally-conductive contact with the back face of the substrate. A second clamping member is positioned at the front face of the circuit board and extends at least partially over the peripheral area of the front face of the substrate. A resilient member is effective between the second clamping member and both the substrate and the circuit board. Fastening elements are used to draw the clamping members together and thereby press the resilient member into firm contact with the substrate and the circuit board. The resilient member has portions of conductive material that connect the contact elements of the substrate to the corresponding contact elements of the circuit board.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
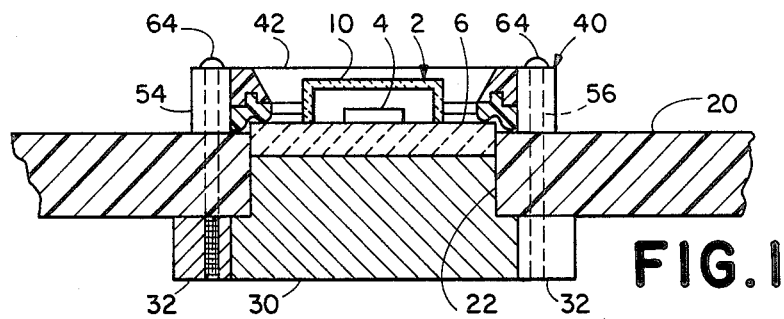
FIG. 1 is a sectional view of a hybrid circuit mounted to a circuit board.
Figure 2:
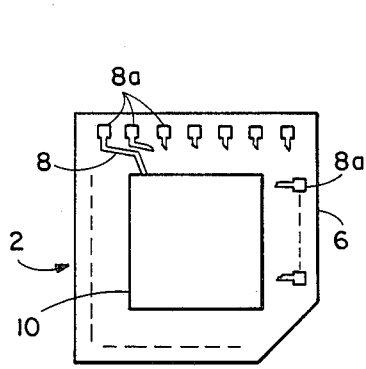
FIG. 2 is a top plan view of the hybrid circuit.

A hybrid integrated circuit 2 comprises a monolithic integrated circuit chip 4 that is mounted on a substrate 6 of ceramic material. The substrate is generally square in shape, but has one corner cut off at 45°. The contact pads of the chip are connected to conductor runs 8 of the substrate by bondwires (not shown). A lid 10 is fitted over the chip and is attached to the substrate, leaving the peripheral region of the substrate exposed. The conductor runs 8 extend under the rim of the lid and terminate in connection pads 8a that are exposed in the peripheral region of the substrate. The connection pads 8a are shown only along one side of the substrate: dashed lines in FIG. 2 indicate that connection pads are provided along the other sides but are not shown in the drawings.

Figure 3:
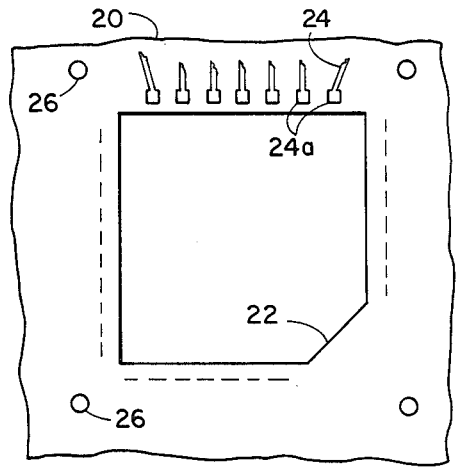
FIG. 3 is a partial top plan view of the circuit board.
Figure 4:
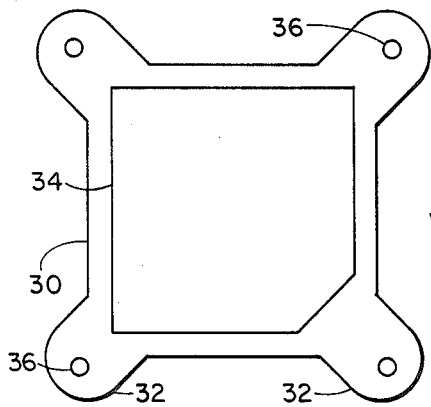
FIG. 4 is a top plan view of a first component shown in FIG. 1.
Figure 5:
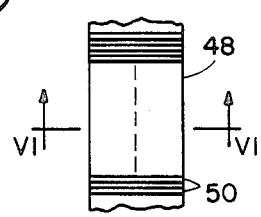
FIG. 5 is a partial bottom plan view of a second component shown in FIG. 1.
Figure 6:
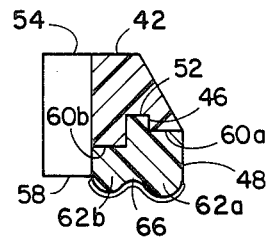
FIG. 6 is a sectional view on the line VI—VI of FIG. 5.

A circuit board 20 is formed with an aperture 22 that extends right through the circuit board and is of the same shape as the substrate. Thus, the aperture is square, except that it has one corner cut off at 45 degrees. The substrate is placed in the aperture of the circuit board, and the shaping of the substrate 6 and the aperture 22 ensures that the substrate can be inserted into the aperture in only one position. The circuit board includes conductor runs 24 that terminate about the periphery of the aperture in respective connection pads 24a. The connection pads 24a are distributed about the aperture in a pattern that corresponds to the pattern of connection pads 8a about the peripheral region of the substrate. The connection pads 24a are shown only along one side of the aperture: dashed lines in FIG. 3 indicate that connection pads are provided along the other sides but are not shown in the drawings. The circuit board is formed with holes 26, one adjacent each corner of the aperture 22. The aperture 22 and the holes 26 are precisely positioned relative to the connection pads 24a.

A metal heat sink member 30 is in the form of a generally rectangular plate having ears 32 at its four corners and a pedestal 34 at its upper surface. The cross-sectional shape of the pedestal is substantially the same as the shape of the substrate and the aperture, i.e. square with one corner cut off at 45 degrees. The ears 32 are formed with internally threaded holes 36 that are at the same positions relative to the pedestal as the holes 26 in the circuit board are relative to the aperture 22. Thus, when the pedestal 34 is inserted upwardly into the aperture 22, the holes 36 of the heat sink member are aligned with the holes 26 of the circuit board.

A retaining frame 40 has four sides 42 and is generally square in configuration. At the underside of the frame, the four sides are formed with an endless recess 46. A frame-like body 48 of elastomeric material has discrete strips 50 of metal bonded to its lower face and includes a ridge 52 that extends upwardly and fits in the recess 46 of the retaining frame. The retaining frame includes an ear 54 at each corner, similar to the heat sink member 30, and each ear is formed with a hole 56. The positioning of the holes 56 relative to each other is the same as that of the holes 26 in the circuit board. The ears 54 extend downwardly beyond the sides 42 of the frame and have abutment surfaces 58.

The frame 40 is identical to the frame that is used in the practical implementation of the device described in U.S. Pat. No. 4,255,003. The inner lower surface portion 60a is at a height of 1.45 mm relative to the abutment surfaces 58 of the ears 54 (which coincide with the top face of the circuit board), whereas the outer lower surface portion 60b is at a height of 0.81 mm. The body of elastomeric material is similar to that which is used in the practical implementation of the device described in U.S. Pat. No. 4,255,003, and has inner and outer lobes 62a and 62b that define a groove 66 therebetween. However, whereas the lobe 62b extends 1.02 mm below the surface 60b, the lobe 62a extends 1.65 mm below the surface 60a. The metal strips 50 may be of substantially the same width (0.64 mm) and at substantially the same spacing (0.64 mm) as the connection pads 8a and 24a. However, it is preferred that the strips be narrower than the pads 8a and 24a, and at a smaller spacing (e.g. 0.51 mm wide and with 0.51 mm spaces), in order to enlarge the tolerance in positioning of the body 48 relative to the circuit board. In this case, the body 48 may be made using the techniques disclosed in co-pending application Ser. No. 913,029 filed Sept. 29, 1986.

Screws 64 are fitted through the holes 56 of the retaining frame and the holes 26 of the circuit board and engage the holes 36 of the heat sink member and are used to draw the retaining frame and the heat sink member together. The body of elastomeric material is compressed between the sides of the frame and both the circuit board and the substrate. Engagement of the abutment surfaces 58 of the ears 54 of the frame with the upper surface of the circuit board limits the extent to which the elastomeric material is compressed. The strips 50 of conductive material contact the connection pads 8a of the substrate and the connection pads 24a of the circuit board. Compression of the elastomeric material provides contact force for the pressure connection between the conductive strips and the contact pads, and also maintains the back face of the substrate in contact with the pedestal of the heat sink member. Therefore, electrical connection is provided between each substrate pad 8a and the corresponding circuit board pad 24a, and a good thermally-conductive contact is provided between the substrate and the heat sink member.

Because the back face of the substrate 6 is in direct contact with the heat sink member 30, the amount of heat that can be removed from the chip 4 is essentially independent of the thickness and nature of the circuit board 20.

In an implementation of the invention, the nominal thickness of the substrate 6, the nominal thickness of the circuit board 20 and the nominal height of the pedestal 34 are selected so as to place the top face of the substrate 6 flush with the top face of the circuit board 20, so that when the screws 64 are tightened, the inner lobe is compressed to a thickness of 1.45 mm. This degree of compression provides adequate contact force between the metal strips 50 and the connection pads 8a. The actual position of the top face of the substrate relative to the top face of the circuit board depends on manufacturing tolerances, which are such that the range of probable values for the contact force between the metal strips 50 and the connection pads 8a are acceptable.

It will be appreciated that the present invention is not restricted to the particular embodiment that has been described and illustrated, and that variations may be made therein without departing from the scope of the invention as defined in the appended claims and equivalents thereof.

We claim:
1. In combination,
a circuit board having first and second opposite main faces and formed with an aperture that extends therethrough between the opposite main faces, the circuit board comprising dielectric material and runs of conductive material that are supported by the dielectric material in mutually electrically isolated relationship, the runs of conductive material terminating in connection pads that are exposed at the first main face of the circuit board and are distributed about the periphery of the aperture in the circuit board, a substrate of dielectric material having first and second opposite main faces, the substrate being fitted in the aperture of the circuit board, conductor runs on the first main face of the substrate and terminating in respective connection pads that are distributed about a peripheral region of the first main face, an integrated circuit chip mounted on the first main face of the substrate, a first clamp member of thermally-conductive material, the first clamp member being homogeneous and having a peripheral portion that engages the second main face of the circuit board and a pedestal portion that enters the aperture of the circuit board and engages the second main face of the substrate, the height of the pedestal portion being less than the thickness of the circuit board, a second clamp member, a resilient member comprising dielectric material and portions of conductive material supported by the dielectric material in mutually electrically isolated relationship and exposed at a face of the resilient member, the resilient member being positioned in engagement with the second clamp member and having said face presented towards both the substrate and the circuit board, and releasable fastening means which engage the clamp members and hold the first clamp member in pressure contact with the second main face of the substrate and the second main face of the circuit board and hold said face of the resilient member in contact with the substrate and the circuit board, whereby said portions of conductive material provide electrical connection between the connection pads of the substrate and the connection pads of the circuit board, and upon release of the fastening means the first clamp member can be removed from contact with the substrate and the circuit board.

2. A combination according to claim 1, wherein the second clamp member has an inner surface portion presented towards the peripheral region of the substrate and an outer surface portion presented towards the circuit board, and the resilient member has an inner portion that is compressed between the inner surface portion of the second clamp member and the peripheral region of the substrate and an outer portion that is compressed between the outer surface portion of the second clamp member and the circuit board.

3. A combination according to claim 2, wherein the inner and outer portions of the resilient member have respective lobes that engage the substrate and the circuit board respectively.

4. A combination according to claim 1, wherein the thickness of the substrate is less than that of the circuit board.

5. A combination according to claim 4, wherein the first main face of the substrate is substantially coplanar with the first main face of the circuit board and the second clamp member has an abutment surface for engaging the first main face of the circuit board and limiting the degree of compression of the resilient member.

6. A combination according to claim 1, wherein the sum of the height of the pedestal and the thickness of the substrate is substantially equal to the thickness of the circuit board.

* * * * *